(12) United States Patent
Kim

(10) Patent No.: US 8,072,038 B2
(45) Date of Patent: Dec. 6, 2011

(54) IMAGE SENSOR

(75) Inventor: Tae Gyu Kim, Masan-si (KR)

(73) Assignee: Dongbu HiTek, Co., Ltd., Seoul (KR)

( * ) Notice: Subject to any disclaimer, the term of this patent is extended or adjusted under 35 U.S.C. 154(b) by 125 days.

(21) Appl. No.: 12/508,312

(22) Filed: Jul. 23, 2009

(65) Prior Publication Data
US 2010/0025800 A1  Feb. 4, 2010

(30) Foreign Application Priority Data
Jul. 29, 2008  (KR) .................. 10-2008-0074162

(51) Int. Cl.
*H01L 27/14* (2006.01)
(52) U.S. Cl. ............ 257/431; 257/E31.124; 257/E27.13
(58) Field of Classification Search .............. 257/459, 257/440, 443, E31.124, 431, 428, E27.13
See application file for complete search history.

(56) References Cited

U.S. PATENT DOCUMENTS

| | | | |
|---|---|---|---|
| 4,737,833 A | * | 4/1988 | Tabei ............................ 257/440 |
| 2006/0290001 A1 | * | 12/2006 | Sulfridge ...................... 257/774 |

* cited by examiner

*Primary Examiner* — Thomas L Dickey
*Assistant Examiner* — Nikolay Yushin
(74) *Attorney, Agent, or Firm* — The Law Offices of Andrew D. Fortney; Andrew D. Fortney; Sharon E. Brown Turner

(57) ABSTRACT

An image sensor having greatly improved physical and electrical bonding forces between a photodiode and a substrate, and a manufacturing method thereof. The image sensor includes a semiconductor substrate and readout circuitry, a dielectric layer on the semiconductor substrate, a metal line in the dielectric layer, electrically connected with the readout circuitry, an image sensing device including first and second impurity regions on the dielectric layer, a via hole through the dielectric layer and the image sensing device, a hard mask in the via hole, and a lower electrode in the via hole to connect the first impurity region with the metal line.

20 Claims, 8 Drawing Sheets

IMAGE SENSOR

This application claims the benefit of Korean Patent Application No. 10-2008-0074162, filed on Jul. 29, 2008, which is hereby incorporated by reference as if fully set forth herein.

BACKGROUND OF THE INVENTION

1. Field of the Invention

The present invention relates to an image sensor and a manufacturing method thereof, and more particularly, to an image sensor capable of greatly improving a physical and electrical bonding force between a photodiode and a substrate including readout circuitry, by adopting a vertical photodiode, and a method of manufacturing the same.

2. Discussion of the Related Art

One type of complementary metal oxide semiconductor (CMOS) image sensor is structured in such a manner that a photodiode that receives light and converts an optical signal to an electric signal is horizontally adjacent to a transistor region that processes the electric signal. Such a horizontal-type image sensor is restricted to increase a light receiving area, that is, a fill factor in a limited area.

In order to overcome the restriction, the photodiode may be vapor-deposited using amorphous silicon (Si). Alternatively, the readout circuitry may be formed on a Si semiconductor while the photodiode is formed in a separate wafer, then bonded to the substrate containing the readout circuitry by wafer-to-wafer bonding. Such a structure will be referred to as a 3D image sensor. The photodiode and the readout circuitry are connected to each other by a metal line.

In case of wafer-to-wafer bonding, however, the bonding force may be insufficient because bonding surfaces of the wafers may be uneven. More specifically, since a metal line connecting the photodiode with a circuit region is exposed at the surface of the interlayer dielectric, the surface profile of the interlayer dielectric may become uneven, thereby deteriorating the bonding force to the photodiode formed on the interlayer dielectric.

A deep via hole may be formed in the wafer including the photodiode to interconnect the photodiode and the readout circuit region. After that, a metal layer connecting the deep via hole with the metal line on the wafer with the readout circuitry may be formed, and then a plug may be formed by selectively etching the metal layer. However, the etching for forming the plug has such a poor uniformity that variations may be induced according to pixels or wafers (e.g., pixel-to-pixel variations and/or wafer-to-wafer variations).

SUMMARY OF THE INVENTION

Accordingly, the present invention is directed to an image sensor and a manufacturing method thereof that substantially obviate one or more problems due to limitations and disadvantages of the related art.

An object of the present invention is to provide an image sensor achieving an excellent physical and electrical bonding force between a separately-formed photodiode and a substrate including readout circuitry, by employing a vertical photodiode, and a manufacturing method thereof.

Another object of the present invention is to provide an image sensor electrically connecting an electrode for signal output only to one or more regions of the photodiode having a first impurity type, and a manufacturing method thereof.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure(s) and/or method(s) particularly pointed out in the written description and claims hereof as well as the appended drawings.

To achieve these objects and other advantages and in accordance with the purpose(s) of the invention, as embodied and broadly described herein, an image sensor may comprise a semiconductor substrate having readout circuitry thereon, a dielectric layer on the semiconductor substrate, a metal line in the dielectric layer and electrically connected with the readout circuitry, an image sensing device including a first impurity region and a second impurity region on the dielectric layer, a via hole through the dielectric layer and the image sensing device to expose the metal line, a hard mask on a sidewall of the via hole corresponding to the second impurity region, and a lower electrode in the via hole to connect the first impurity region with the metal line.

In another aspect of the present invention, a method of manufacturing an image sensor may comprise forming readout circuitry and a metal line on a semiconductor substrate, forming a dielectric layer on the semiconductor substrate and the metal line, forming an image sensing device on the dielectric layer, the image sensing device comprising a first impurity region and a second impurity region, forming a first via hole in the image sensing device so that the first impurity region is partly exposed over the metal line, forming a hard mask on the sidewall of the first via hole, forming a second via hole by etching the image sensing device and the dielectric layer under the first via hole to expose the metal line, and forming a lower electrode in the second via hole to connect the first impurity region with the metal line.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle(s) of the invention. In the drawings:

FIG. 2 illustrates an image sensing device formed on or attached to a dielectric layer of the semiconductor substrate.

FIG. 3 illustrates a first hard mask layer formed on the image sensing device.

FIG. 4 illustrates a first hard mask pattern.

FIG. 5 illustrates a first via hole formed in the image sensing device.

FIG. 6 illustrates a second hard mask layer formed along surfaces of the first via hole and the first hard mask pattern.

FIG. 7 illustrates a second hard mask pattern formed on the sidewall of the first via hole.

FIG. 8 illustrates a second via hole formed through the image sensing device and the dielectric layer.

FIG. 9 illustrates a lower electrode formed in the second via hole.

FIG. 10 illustrates a device isolation region formed in the image sensing device.

FIG. 11 illustrates a third via hole formed in the image sensing device.

FIG. 12 illustrates a third hard mask layer formed along surfaces of the third via hole and the image sensing device.

FIG. 13 illustrates a third hard mask pattern formed on the sidewall of the third via hole.

FIG. 14 illustrates a fourth via hole formed through the image sensing device and the dielectric layer.

FIG. 15 illustrates a lower electrode formed in the fourth via hole.

DETAILED DESCRIPTION OF THE INVENTION

Figure 1:
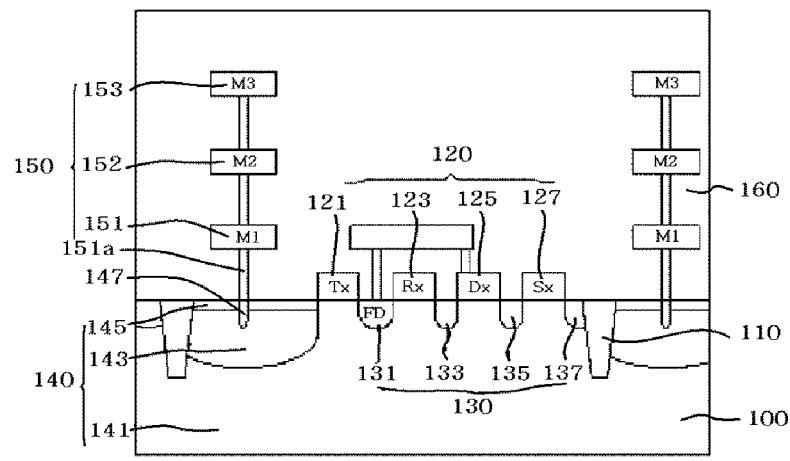
FIG. 1 is a cross-sectional view illustrating a general structure of an image sensor.

Reference will now be made in detail to preferred embodiments of the present invention, examples of which are illustrated in the accompanying drawings. Wherever possible, the same reference numbers will be used throughout the drawings to refer to the same or like parts.

It will be understood that when an element such as a layer is referred to as being "on" or "under" another element, the element may be disposed "directly" on another element or "indirectly" by having an interposing element between them.

In the drawings, thickness and size of respective layers may be exaggerated, omitted or briefly shown for more convenient and clear explanation. Relative sizes of other elements may also be not correctly illustrated.

Also, the present invention is not limited to a complementary metal oxide semiconductor (CMOS) sensor but to any other image sensors requiring a photodiode, such as a charge coupled device (CCD).

Embodiment 1

Figure 9:
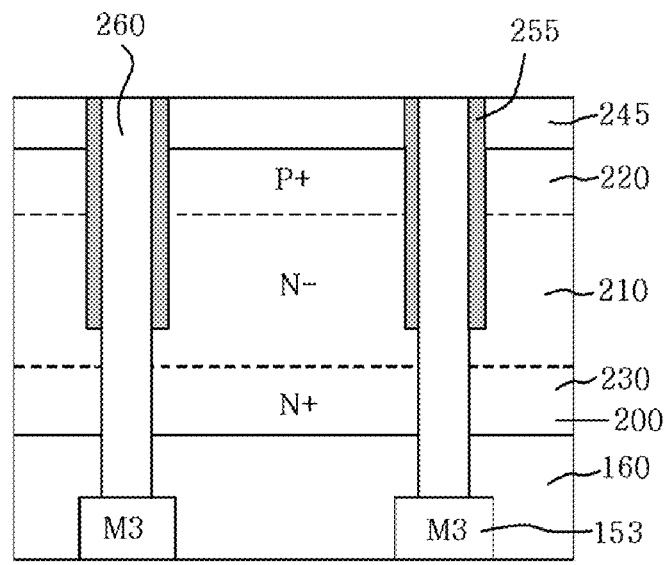

FIG. 9 is a cross-sectional view showing an exemplary image sensor according to first embodiment(s) of the present invention.

An exemplary image sensor in accordance with a first exemplary embodiment includes a semiconductor substrate 100 provided with readout circuitry 120, a dielectric layer 160 formed on the semiconductor substrate 100, a metal line 150 formed in the dielectric layer 160, electrically connected with the readout circuitry 120, an image sensing device 200 including a first impurity region 210 and a second impurity region 220 on the dielectric layer 160, a second via hole 320 through the dielectric layer 160 and the image sensing device 200 so that the metal line 150 is exposed, a second hard mask 255 formed on a sidewall of the second via hole 320 corresponding or adjacent to the second impurity region 220, and a lower electrode 260 formed in the second via hole 320 to connect the first impurity region 210 with the metal line 150.

The second hard mask 255 is on the sidewall of the second via hole 320 and covers the second impurity region 220. The lower electrode 260 is formed in the second via hole 320 so that the first impurity region 210 and a third metal are electrically connected to each other by the lower electrode 260. That is, the lower electrode 260 may facilitate photodiode operation by being brought into contact with the first impurity region 210 but not the second impurity region 220.

Unexplained reference symbols in FIG. 9 will be referred to in the following description regarding the manufacturing method.

Hereinafter, an exemplary method of manufacturing the image sensor according to the first embodiment(s) will be explained with reference to FIGS. 2 through 10.

Referring to FIG. 1, the metal line 150 and the dielectric layer 160 are formed on the semiconductor substrate 100 formed with the readout circuitry 120. For example, a device isolation layer 110 is formed on or in the semiconductor substrate 100 (which may have a second conductivity type) to thereby define an active region. Readout circuitry 120 including one or more transistors is formed in the active region. For example, the readout circuitry 120 may include a transfer transistor Tx 121, a reset transistor Rx 123, a drive transistor Dx 125, and a select transistor Sx 127. Next, one or more ion implantation regions 130 including a floating diffusion region FD 131 and source/drain regions 133, 135 and 137 may be formed in the respective transistors.

The processes for forming the readout circuitry 120 on the semiconductor substrate 100 may further include forming an electrical junction area 140 on or in the semiconductor substrate 100 and forming a first conductivity type connection region 147 on or in an upper part of the electrical junction area 140 to be in connection with the metal line 150. The electrical junction area 140 may comprise a P-N junction, although it is not limited thereto. For example, the electrical junction area 140 may include a first conductivity type ion implantation layer 143 formed on or in a second conductivity type well 141 or a second conductivity type epitaxial layer, and a second conductivity type ion implantation layer 145 formed on or in the first conductivity type ion implantation layer 143. In addition, the P-N junction 140 may be in the form of a P0 145/N− 143/P− 141 junction, although it is not limited to such an embodiment.

According to this embodiment, full dumping or transfer of photocharge(s) can be achieved by designing the device so that there is a potential difference between the source and drain at opposite sides of the transfer transistor Tx. Therefore, as the photocharge(s) generated in the photodiode is/are dumped or transferred to the floating diffusion region FD 131, sensitivity of the output image can be enhanced. More specifically, the electrical junction area 140 in the semiconductor substrate 100 and the readout circuit 120 may cause a potential difference between the source and drain of the transfer transistor Tx 121, thereby enabling full transfer of the photocharge(s).

The photocharge dumping or transfer structure will now be described in detail.

Differently from the floating diffusion node FD 131, which is an N+ junction, an applied voltage is not fully transmitted, but rather, is pinched off at a predetermined voltage in the P/N/P junction of the electrical junction area 140. This voltage is called a pinning voltage, which depends on the doping concentrations of the P0 region 145 and the N− region 143.

To be more specific, an electron generated in the photodiode 210 moves to the P/N/P junction 140, and is transferred to the node of the floating diffusion FD 131 and converted into a voltage when the transfer transistor Tx 121 is turned on. Since a maximum voltage value of the P0/N−/P-junction 140 becomes the pinning voltage, and a maximum voltage value of the floating diffusion node FD 131 becomes a threshold voltage Vth=Vdd−Rx, an electron generated from the photodiode 210 in the upper part of a chip can be fully transferred or "dumped" to the floating diffusion node FD 131 without causing charge sharing owing to the potential difference between the source and drain terminals of the transfer transistor Tx 131.

That is, the P0/N−/P-well junction 140 is formed in the semiconductor (e.g., silicon) substrate 100, instead of an N+/P-well junction, to allow a positive voltage to be applied to the N− region 143 of the P0/N−/P-well junction 140 and a ground voltage to be applied to the P0 region 145 and the P-well 141 during a 4-Tr active pixel sensor (APS) reset operation, so that a pinch-off is generated at the P0/N−/P-well double junction 140 at a predetermined voltage or higher, as in a bipolar junction transistor (BJT) structure, the predetermined voltage referred to as the pinning voltage. Therefore, a potential difference is generated between the source and the drain of the transfer transistor Tx 121, thereby restraining charge sharing from occurring during the on/off operations of the transfer transistor Tx 121. Consequently, various embodiments of the present invention may effectively avoid deterioration of saturation and sensitivity that happens in the conventional structure when the photodiode is connected simply by an N+ junction.

In addition, the first conductivity type connection region 147 may be formed between the photodiode (not shown in FIG. 1) and the readout circuitry 120 to provide a swift movement path for the photocharge(s), so that a dark current source is minimized and the deterioration of saturation and sensitivity reduction is prevented.

For this, according to one aspect of the first embodiment(s), an N+ doping region 147 (e.g., a first conductivity type connection region) for an ohmic contact may be formed on the surface of the P0/N−/P-junction 140. The N+ region 147 may contact the N− layer 143 by penetrating the P0 layer 145. Here, a width of the first conductivity type region 147 may be minimized in order to restrain, minimize or prevent the first conductivity type connection region 147 from becoming a leakage source. To this end, for example, a plug implantation may be performed after etching a contact hole for the first metal contact 151a. However, in another example, prior to formation of the bulk dielectric layer 160, an ion implantation pattern (not shown) may be formed and used as an ion implantation mask to produce the first conductivity type connection region 147.

That is, a reason for locally doping only a contact-formed portion with a relatively heavy dose of first conductivity type dopant (e.g., N+ dopant) in this embodiment is to facilitate forming the ohmic contact while minimizing a dark signal. In case of doping the entire transfer transistor Tx source with an N+ dopant as in the conventional art, a dark signal may be increased by an increased incidence of a Si surface dangling bond.

Next, the metal line 150 and the dielectric layer 160 may be formed on the semiconductor substrate 100, in reverse alternating order. The metal line 150 may include, but is not limited to, the first metal contact 151a, a first metal M1 151, a second metal M2 152, and a third metal M3 153. The dielectric layer 160 may comprise a premetal dielectric (PMD) layer in which contact 151a is formed, first and second intermetal dielectric (IMD) layers formed on first and second metal layers M1 151 and M2 152, respectively, in which contacts connecting an overlying metal layer (e.g., M2 152 and M3 153, respectively) to an underlying metal layer (e.g., M1 151 and M2 152, respectively) and on which the overlying metal layer (e.g., M2 152 and M3 153, respectively) are formed, and a passivation layer (not specifically shown, but substantially the entire portion of dielectric layer 160 above the lowermost surface of third metal layer M3 153). Each of the PMD, IMD and passivation layers may comprise one or more insulators (e.g., a lowermost silicon nitride etch stop layer, a buffer layer comprising $SiO_2$ or silicon rich oxide [SRO], a bulk insulator such as $SiO_2$ or a fluorosilicate glass [FSG], and one or more capping layers such as a tetraethyl orthosilicate [TEOS]-based oxide and/or undoped silicate glass [USG], optionally in that order), and the passivation layer may be formed by chemical vapor deposition (CVD) of such materials, followed by planarization so that the third metal is not exposed. That is, the metal line 150 formed in the dielectric layer 160 is not exposed to the outside. Alternatively, metal layer M1 151 and contact 151a may be formed by a single damascene process in a stack of dielectric layers comprising (in reverse sequence) a silicon nitride layer, a $SiO_2$ layer, a FSG layer, and a buffer layer, and metal layers M2 152 and M3 153 and the corresponding underlying contacts may be formed by a dual damascene process in a similar stack of dielectric layers but in which a silicon nitride etch stop layer may be interposed in the middle of the FSG layer to define an etch stop for forming a trench in which the corresponding metal layer M2 152 or M3 153 is formed. In such an embodiment, the passivation layer may comprise a single USG or other $SiO_2$ layer. Therefore, the dielectric layer 160 having an even uppermost surface profile is exposed on the semiconductor substrate 100.

Figure 2:
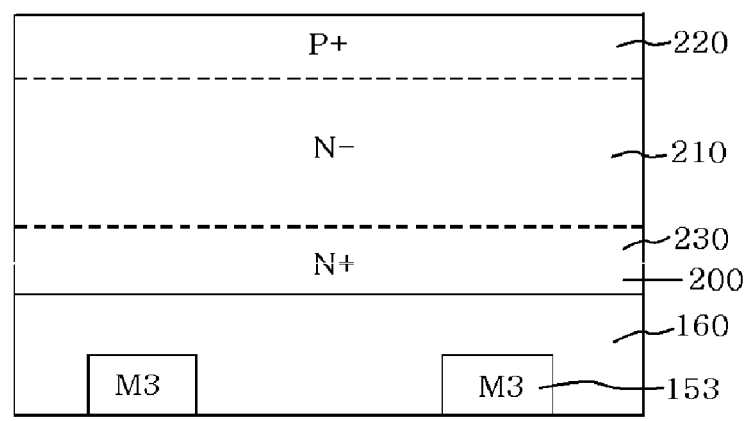
FIG. 2 to FIG. 10 are cross-sectional views illustrating exemplary manufacturing processes for an exemplary image sensor according to first embodiment(s) of the present invention.

Referring to FIG. 2, the image sensing device 200 is formed on or attached to the dielectric layer 160 of the semiconductor substrate 100. The image sensing device 200 may have a PN junction photodiode structure including the first impurity region 210 and the second impurity region 220. A first ion implantation region 230 may be additionally formed at a lower part of the first impurity region 210 to serve as an ohmic contact. The metal line 150 and the dielectric layer 160 shown in FIG. 2 will not be explained again since they generally have the same structures as those shown in FIG. 1.

The image sensing device 200 may be structured in a manner that the first and the second impurity regions 210 and 220 are formed by ion-implanting a relatively light dose of an N-type (i.e., N−) impurity and a relatively heavy dose of a P-type (i.e., P+) impurity sequentially (or in reverse sequence) in a separate crystalline p-type carrier substrate (not shown). In addition, the first ion implantation region 230 may be formed by ion-implanting a high-concentration of an N-type (i.e., N+) impurity to a lower part of the first impurity region 210 (e.g., an uppermost part of the separate single crystal substrate). The first ion implantation region 230 may help reduce the contact resistance of the image sensing device 200 and the metal line 150. The separate single crystal substrate may be bonded face-to-face with dielectric layer 160, then the portion of the separate single crystal substrate other than image sensing device (e.g., photodiode) 200 can be removed by hydrogen implantation and cleavage along the hydrogen implantation zone of the single crystal substrate. The first impurity region 210 may have a thickness greater than that of the second impurity region 220. In this case, more photoelectrons can be generated since the depletion region is expanded.

Next, the first ion implantation region 230 of the carrier substrate (not shown) is disposed at an upper part of the dielectric layer 160 (generally by relatively shallow implantation into an exposed surface of a second single crystal silicon substrate) and then the semiconductor substrate 100 and the carrier substrate are connected by bonding. The carrier substrate is then removed so that the image sensing device 200 bonded on the dielectric layer 160 is exposed. Consequently, the surface of the second impurity region 220 is exposed.

According to various embodiment(s), by employing a 3D image sensor in which the image sensor 200 is disposed at the upper part of the readout circuitry 120, the fill factor can be improved while reducing, minimizing or preventing one or more defects in the image sensing device 200. Also, since the image sensing device 200 having a smooth or even surface profile is connected to the surface of the dielectric layer 160 which also has a smooth or even surface profile, the bonding force will be improved.

The process of connecting the image sensing device 200 to the metal line 150 will now be explained in detail.

Figure 3:
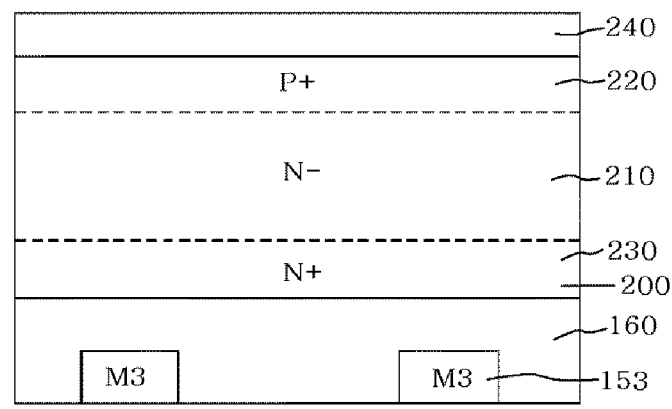

Referring to FIG. 3, a first hard mask layer 240 is formed using an oxide layer or a nitride layer on the image sensing device 200 so as to protect a surface of the image sensing device 200.

Figure 4:
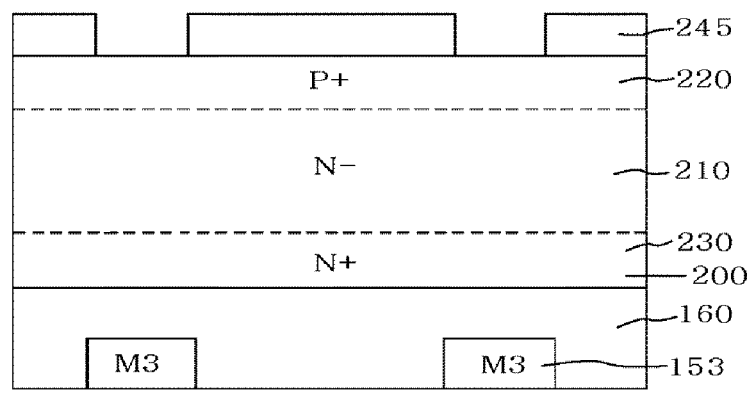

In FIG. 4, a first hard mask 245 is formed by selectively patterning the first hard mask layer 240. More specifically, the first hard mask 245, formed by photolithography and etching the first hard mask layer 240, may expose the surface of the image sensing device 200 at a position corresponding to the third metal pattern 153. The first hard mask 245 may serve as an etching mask for the image sensing device 200 having a crystalline structure.

Figure 5:
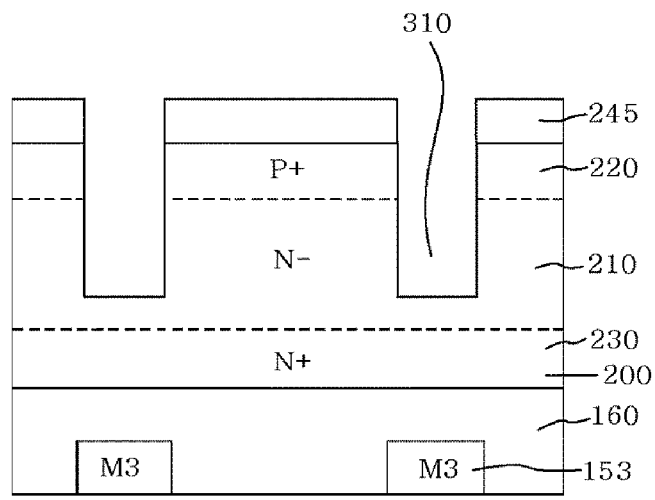

In FIG. 5, a first via hole 310 is formed in the image sensing device 200. Specifically, the first via hole 310 may be formed by selectively etching the image sensing device 200 using the first hard mask 245 as an etching mask. The first via hole 310 partially exposes the first impurity region 210 in the image sensing device 200.

More particularly, the first impurity region 210 above the third metal 153 is selectively exposed through a bottom surface of the first via hole 310. Since the first via hole 310 is formed to a lower part of the first impurity region 210, a sidewall of the second impurity region 220 is totally exposed in the first via hole 310, whereas the first impurity region 210 is exposed to a predetermined depth. Although not shown, the first via hole 310 may be formed to the height of the first ion implantation region 230 (i.e., to a point at or about at the interface between the first impurity region 210 and the first ion implantation region 230).

Figure 6:
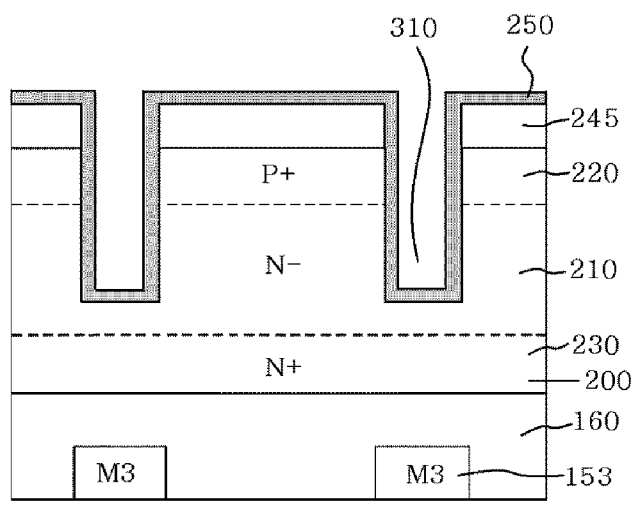

Referring to FIG. 6, a second hard mask layer 250 comprising an oxide layer (e.g., silicon dioxide) and/or a nitride layer (e.g., silicon nitride) is formed along surfaces of the first via hole 310 and the first hard mask 245. The second hard mask layer 250 is thin and deposited conformally along the surface of the first via hole 310, that is, along a sidewall and a bottom surface of the first via hole 310, generally by CVD.

Figure 7:
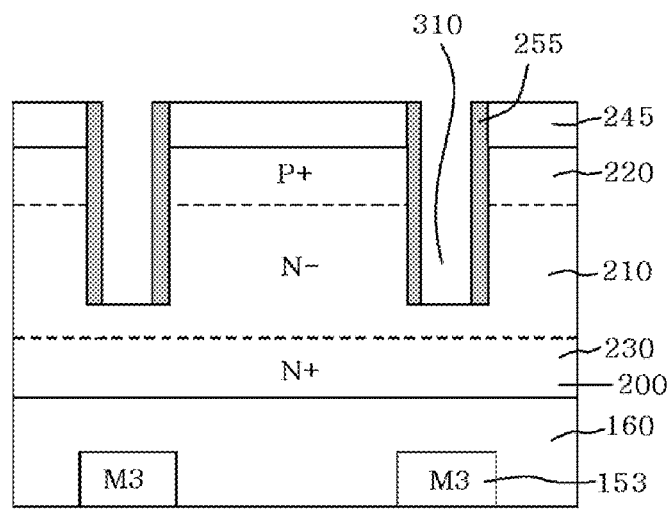

Referring to FIG. 7, the second hard mask 255 is formed on the sidewall of the first via hole 310, for example by performing dry-etching (e.g., an anisotropic etch process) on the second hard mask layer 250. The dry-etching and/or anisotropic etch process can totally remove the second hard mask layer 250 from horizontal surfaces of the first hard mask 245 and the bottom of the first via hole 310. Here, the second hard mask 255 remains only at the sidewall of the first via hole 310 since it is relatively less etched at the sidewall. As a result, the second impurity region 220 and part of the first impurity region 210 which are exposed by the sidewall of the first via hole 310 are protected by the second hard mask 255.

Figure 8:
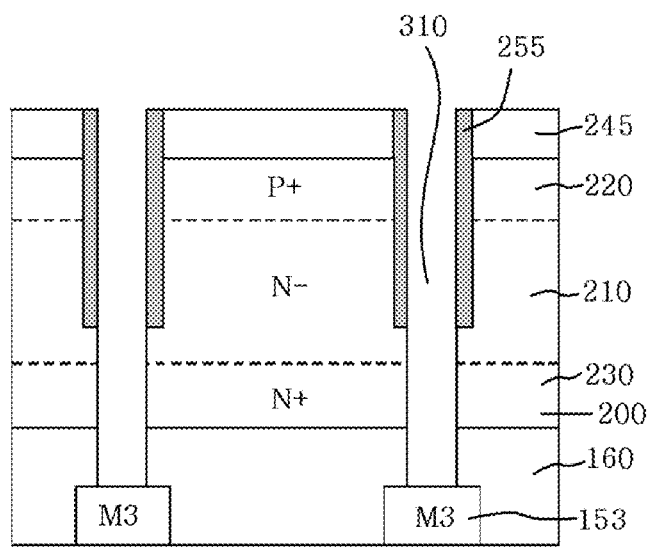

Referring to FIG. 8, the second via hole 320 is formed through the image sensing device 200 and the dielectric layer 160, thereby exposing the third metal 153. The second via hole 320 may be formed by etching the image sensing device 200 and the dielectric layer 160 disposed at a lower part of the first via hole 310, using the first and the second hard masks 245 and 255 as etching masks. Also, the second via hole 320 may be a deep via hole. Therefore, the third metal 153 can be exposed by or through the second via hole 320. Also, the dielectric layer 160, the first ion implantation region 230 and part of the first impurity region 210, where the second hard mask 255 is not formed, may be exposed through the second via hole 320. On the other hand, the second impurity region 220 and part of the first impurity region 210 are protected by the second hard mask 255.

Referring to FIG. 9, the lower electrode 260 is formed in the second via hole 320, and more particularly, to fully fill the second via hole 320. Therefore, the lower electrode 260 may contact part of the first impurity region 210 and the first ion implantation region 230 through the sidewall of the second via hole 320 under the second hard mask 255, and also contact the third metal 153 through a bottom of the second via hole 320. Additionally, the lower electrode 260 may be completely insulated from the second impurity region 220 by the second hard mask 255.

The lower electrode 260 may be produced by filling a gap inside the second via hole 320 with a metal layer and then performing planarization. For example, a metal such as W or Al may be used for the lower electrode 260. Although not shown, a barrier metal such as TiN or a TiN-on-Ti bilayer may be formed before deposition of the metal for the lower electrode 260.

The image sensing device 200 and the third metal 153 can be electrically connected by the lower electrode 260 formed in the second via hole 320. In other words, the lower electrode 260 is in electrically contact with the first impurity region 210 while being insulated from the second impurity region 220 owing to the second hard mask 255. That is, the lower electrode 260 transmitting photoelectrons generated by the image sensing device 200 to the readout circuitry 120 is connected only to the first impurity type regions 210 and 230, and this enables the image sensor to perform signal output normally. This is because a short circuit of the photodiode can be prevented as the lower electrode 260 is connected to the first impurity region 210 while being insulated from the second impurity region 220 by the second hard mask 255.

As described above, since the second hard mask 255 covers the sidewall of the second impurity region 220, the lower electrode 260 can be formed in the second via hole 320 of the image sensing device 200 simply by etching and filling a contact hole without other dedicated processes. Especially, when forming an electrode to transmit photoelectrons generated from the image sensing device 200 to the lower part (e.g., readout circuitry 120), the electrode can be formed in desired regions by omitting an etch process that may deteriorate the uniformity of the bonding surfaces of the dielectric layer 160 and the image sensing device 200.

Figure 10:
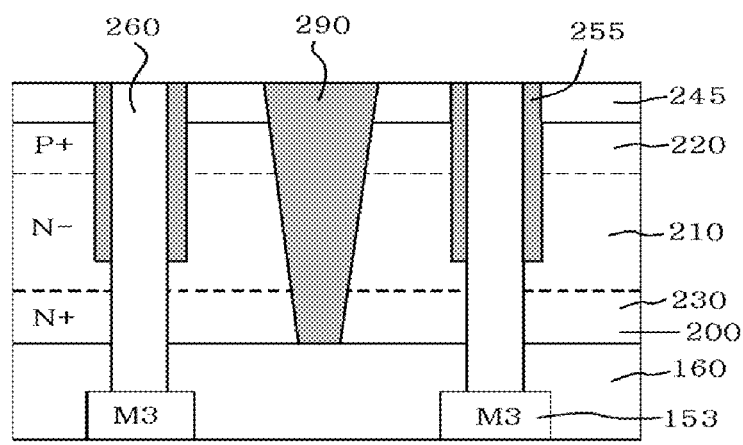

Referring to FIG. 10, a device isolation region 290 is formed in the image sensing device 200 to divide the image sensing device 200 into pixels. The device isolation region 290 may be formed by shallow trench isolation (STI) or ion implantation (e.g., of an insulating impurity such as oxygen and/or nitrogen). In case that the device isolation region 290 has the STI structure, the device isolation region 290 is manufactured by forming a trench penetrating the image sensing device 200 between respective lower electrodes 260 of each pixel and then gap-filling the trench with an insulating material such as silicon dioxide.

Since the image sensing device 200 is formed with the first hard mask 245 thereon, a surface of the image sensing device 200 may be protected during manufacturing of the device isolation region 290.

Although not shown, an upper electrode may be further formed on the image sensing device 200 to apply a ground voltage. The upper electrode may be a transparent electrode (e.g., comprising indium tin oxide) or a metal electrode (e.g., comprising aluminum).

Embodiment 2

Figure 15:
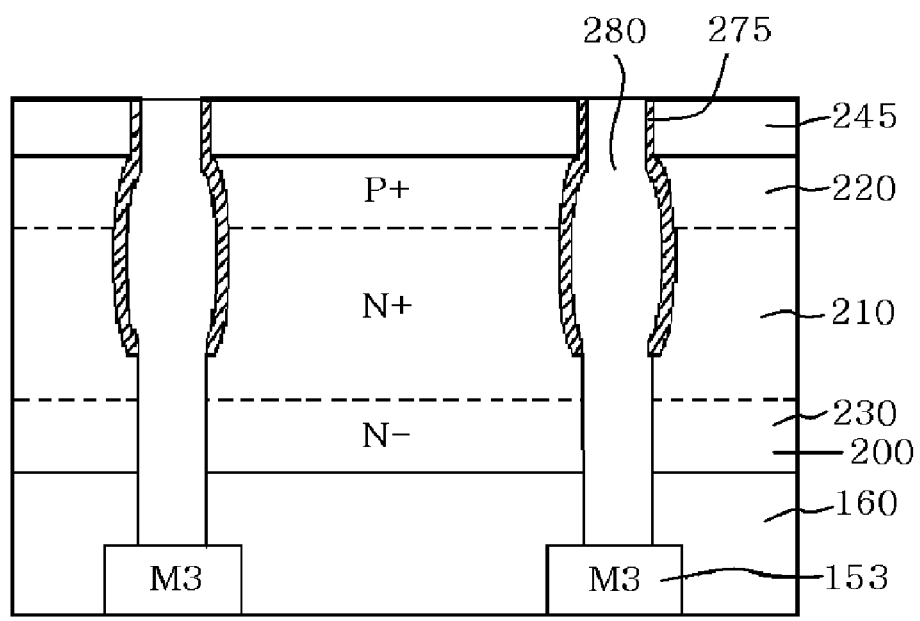

FIG. 15 is a cross-sectional view of an exemplary image sensor according to second embodiment(s) of the present invention.

The exemplary image sensor of the second embodiment(s) includes the semiconductor substrate 100, the readout circuitry 120, the dielectric layer 160 and the metal line 153 on the semiconductor substrate 100, the image sensing device 200 on the dielectric layer 160, a fourth via hole 340 penetrating the dielectric layer 160 and exposing the metal line 153, a third hard mask 275 formed on a sidewall 331 of the fourth via hole 340 corresponding or adjacent to the second impurity region 220 of the image sensing device 200, and the lower electrode 280 in the via hole 340, connecting the first impurity region 210 with the metal line 153. The sidewall 331 of the fourth via hole 340, on which the second hard mask 255 is formed, may have a rounded surface such that a longitudinal middle part of the contact hole 330 has a greater diameter than upper and lower parts of the contact hole 330. Thus, since part of the sidewall 331 is rounded or convex to the image sensing device 200, the second hard mask 255 formed along the sidewall 331 of the fourth via hole 340 accordingly has a rounded surface. Here, as the second hard mask 255 covers the second impurity region 220 and the first impurity region 210 in the fourth via hole 210, the lower electrode 280 can be electrically connected with the first impurity region 210.

Unexplained reference symbols in FIG. 15 will be referred to in the following description about an exemplary manufacturing method.

Hereinafter, an exemplary method of manufacturing an image sensor in accordance with one or more second embodiments will be explained with reference to FIG. 11 to FIG. 15. The same elements as in the first embodiment(s) will be cited by the same reference numerals. The features already explained in the first embodiment(s) will not be explained again.

As shown in FIG. 4, the image sensing device 200 is formed on the dielectric layer 160 of the semiconductor substrate 200, and the first hard mask 245 is formed on the image sensing device 200.

Figure 11:
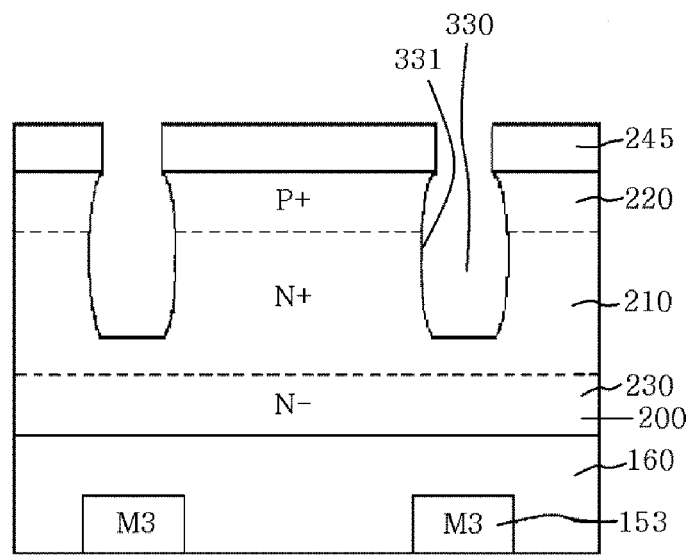
FIG. 11 to FIG. 15 are cross-sectional views illustrating exemplary manufacturing processes for an exemplary image sensor according to second embodiment(s) of the present invention.

Referring to FIG. 11, a third via hole 330 is formed in the image sensing device 200, for example by selectively etching the image sensing device 200 using the first hard mask 245 as an etching mask. The third via hole 330 may expose part of the first impurity region 210 and the second impurity region 220 in the image sensing device 200 at the position corresponding to the third metal 153.

Dividing the sidewall of the third via hole 330 into upper, middle and lower parts in a longitudinal direction, an inner diameter of the third via hole 330 may be widened from the upper part toward the middle part and then narrowed from the middle part toward the lower part. The upper and the lower parts of the third via hole 330 may have the same diameter while the middle part has a greater diameter. As shown in FIG. 11, the sidewall 331 of the third via hole 330 may have a rounded surface, convex toward the image sensing device 200. That is, sidewalls of the third via hole 330 may be rounded to be distanced from each other.

More specifically, the third via hole 330 may be formed by adjusting etching conditions while etching using the first hard mask. For instance, referring to FIG. 5, the first via hole 310 may be formed by plasma etching under conditions comprising injecting about 10~20 sccm of $SF_6$ and $O_2$ in the first embodiment(s). However, and now referring to FIG. 11, the third via hole 330 may be formed by injecting about 30~40 sccm of $SF_6$ and $O_2$. That is, etching is more actively performed as the quantity of the etching gas, one of the etching conditions, is increased, and thus the rounded surface can be formed by adjusting the etching gas quantity. However, the invention is not limited to the etching process as described in this embodiment, and the sidewall of the third via hole 330 may be formed by other methods. For example, a first portion of the third via hole 330 may be formed by wet etching, and a second portion of the third via hole 330 may be formed by dry etching.

The first impurity region 210 is selectively exposed through a bottom surface of the third via hole 330. The second impurity region 220 is totally exposed by the sidewall 331 of the third via hole 330, while the first impurity region 210 is exposed up to a predetermined depth. Although not illustrated, the third via hole 330 may be formed to the height of the first ion implantation region 230.

Figure 12:
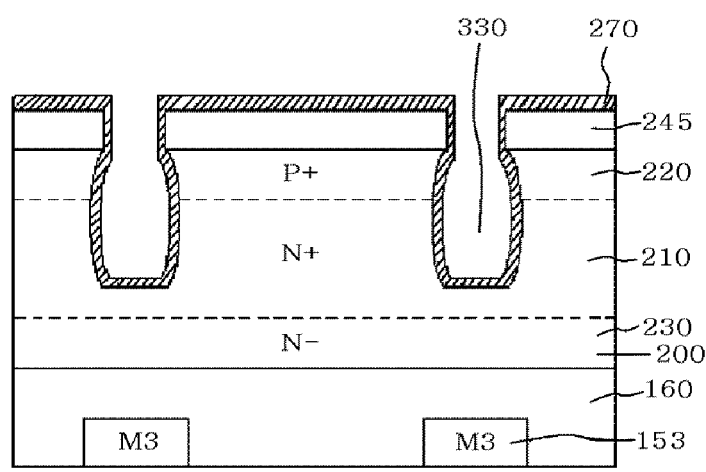

Referring to FIG. 12, a third hard mask layer 270 is formed along surfaces of the third via hole 330 and the image sensing device 200 (e.g., the first hard mask 245), for example using an oxide layer and/or a nitride layer. The third hard mask layer 270 is thin and is conformally deposited along the surface of the third via hole 330, that is, along the sidewall 331 and the bottom surface of the third via hole 330.

Figure 13:
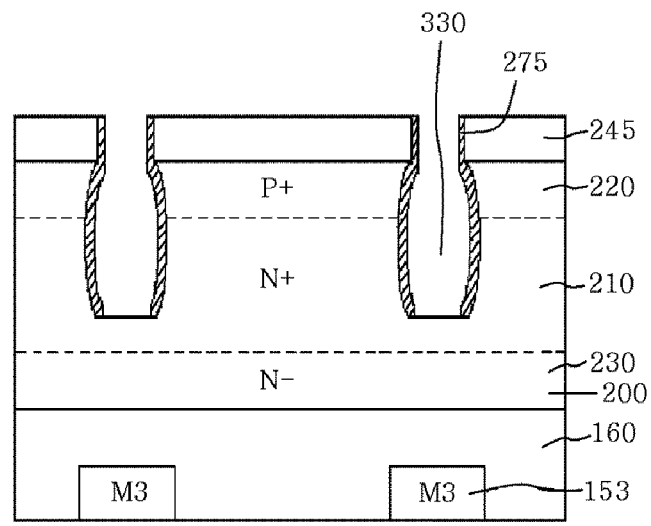

Referring to FIG. 13, the third hard mask 275 is formed on the sidewall of the third via hole 330, for example by performing dry-etching of the third hard mask layer 270. The third hard mask layer 270 on the surface of the first hard mask 245 and the bottom surface of the third via hole 330 can be totally removed by dry-etching the vertically exposed regions of the third hard mask layer 270. Here, the third hard mask layer 270 on the sidewall 331 of the third via hole 330 may not be removed by the dry-etching due to straightness (i.e., anisotropy) of the dry-etching. Especially, the third hard mask layer 270 formed along the rounded surface of the sidewall 331 of the third via hole 330 is less influenced by the dry-etching, and is maintained almost as it is. Accordingly, the second impurity region 220 and part of the first impurity region 210 in the third via hole 330 are protected by the third hard mask 275 formed on the sidewall 331 of the third via hole 330.

Figure 14:
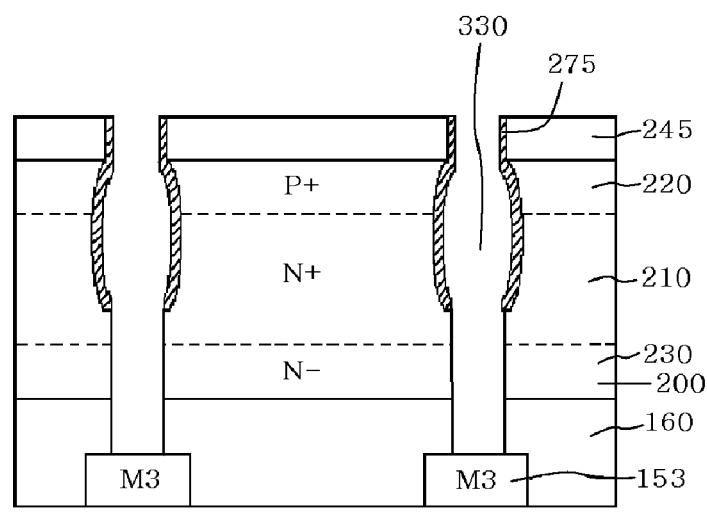

Referring to FIG. 14, the fourth via hole 340 is formed through the image sensing device 200 and the dielectric layer 160, thereby exposing the third metal 153. The fourth via hole 340 may be formed by etching the image sensing device 200 and the dielectric layer 160, using the first and the third hard masks 245 and 275 as etching masks. Also, the fourth via hole 340 may be a deep via hole.

Therefore, the third metal 153 can be exposed through the fourth via hole 320. Also, part of the first impurity region 210, the first ion implantation region 230 and the dielectric layer 160 under the third hard mask 275 may be exposed through the fourth via hole 320. On the other hand, the second impurity region 220 and part of the first impurity region 210 are covered with the third hard mask 275 because loss of the third hard mask 275 on the rounded surface of the third via hole 330 is restrained during the etching of the fourth via hole 340.

Referring to FIG. 15, a lower electrode 280 is formed in the fourth via hole 340. The lower electrode 280 may contact the first impurity region 210 and the first ion implantation region 230 through the fourth via hole 340, and also contact the third metal 153 through a bottom of the fourth via hole 340. In addition, the lower electrode 280 may be electrically insulated from the second impurity region 220 by the third hard mask 275.

The lower electrode 280 may be formed by filling the fourth via hole 340 with a metal layer (e.g., by CVD) and then performing planarization (e.g., chemical mechanical polishing). For example, metals such as W and Al may be used for the lower electrode 280.

The image sensing device 200 and the third metal 153 can be electrically connected by the lower electrode 280 in the fourth via hole 340. In other words, the lower electrode 280 electrically connects to the first impurity region 210 through the contact 280 in the fourth via hole 340, while being electrically insulated from the second impurity region 220 due to the second hard mask 255. That is, the lower electrode 280 transmitting photoelectrons generated by the image sensing device 200 to the readout circuitry 120 is connected to the first impurity-type regions 210 and 230, and this enables the image sensor to perform signal output normally.

As is apparent from the above description, in accordance with an image sensor and manufacturing method thereof according to any one of the above-described embodiments of the present invention, near-100% fill factor may be accomplished by adopting a vertical integration structure including readout circuitry and an image sensing device. Additionally, as the image sensing device is bonded to a surface of a dielectric layer of a substrate, the physical and electrical bonding force of the substrate is improved, accordingly improving the quality of the image sensor.

Furthermore, according to various embodiments, a deep via hole is formed through the image sensing device, and a lower electrode is formed in the deep via hole so that electrons of the image sensing device are transmitted to the readout circuitry. Accordingly, signal output of the photodiode can be normally performed. Especially, since the lower electrode is connected only to first impurity-type regions, and not to a second impurity-type region, due to a hard mask formed in the deep via hole to cover the second impurity-type region of the image sensing device, the lower electrode may serve as part of a photodiode.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An image sensor comprising:
   a semiconductor substrate having readout circuitry thereon;
   a dielectric layer on the semiconductor substrate;
   a metal line in the dielectric layer and electrically connected with the readout circuitry;
   an image sensing device including a first impurity region and a second impurity region on the dielectric layer, wherein the first impurity region further includes a first ion implantation region at a lower part thereof;
   a via hole through the dielectric layer and the image sensing device, exposing the metal line;
   a hard mask on a sidewall of the via hole adjacent to the second impurity region, wherein the hard mask is on the sidewall of the via hole and exposes the first ion implantation region while covering at least part of the first impurity region and an entirety of the second impurity region; and
   a lower electrode in the via hole to connect the first impurity region with the metal line.

2. The image sensor according to claim 1, wherein the via hole includes the sidewall and a bottom surface; and
   the sidewall of the via hole and the hard mask have a rounded surface such that a longitudinal middle part thereof has a greater diameter than upper and lower parts thereof.

3. The image sensor according to claim 2, wherein the rounded surface of the hard mask is along the sidewall of the via hole.

4. The image sensor according to claim 1, wherein the image sensing device includes a dielectric hard mask thereon.

5. The image sensor according to claim 4, wherein the hard mask in the via hole comprises an oxide layer or a nitride layer.

6. The image sensor according to claim 4, wherein the dielectric hard mask comprises an oxide layer or a nitride layer.

7. The image sensor according to claim 1, wherein the readout circuitry comprises one or more transistors.

8. The image sensor according to claim 7, wherein the one or more transistors comprise a transfer transistor, a reset transistor, a drive transistor, and a select transistor.

9. The image sensor according to claim 1, wherein the metal line comprises a first metal contact, a first metal, a second metal, and a third metal.

10. The image sensor according to claim 9, wherein the third metal is electrically connected to the image sensing device by the lower electrode.

11. The image sensor according to claim 9, wherein the dielectric layer comprises a premetal dielectric, a first intermetal dielectric, a second intermetal dielectric, and a passivation layer.

12. The image sensor according to claim 11, wherein the dielectric layer further comprises the first metal contact in the premetal dielectric.

13. The image sensor according to claim 11, wherein the premetal dielectric, the first intermetal dielectric, the second intermetal dielectric, and the passivation layer each comprises an insulator.

14. The image sensor according to claim 13, wherein the insulator comprises a single undoped silicate glass.

15. The image sensor according to claim 1, wherein the semiconductor substrate further comprises an electrical junction area.

16. The image sensor according to claim 15, wherein the electrical junction area comprises a first conductivity region.

17. The image sensor according to claim 16, wherein the electrical junction area further comprises a P-N-P junction.

18. The image sensor according to claim 17, wherein the P-N-P junction comprises a first conductivity type ion implantation layer, a second conductivity type well, and a second conductivity type ion implantation layer.

19. The image sensor according to claim 18, wherein the first conductivity region comprises an $N^+$ doping region.

20. The image sensor according to claim 19, wherein the $N^+$ doping region contacts the first conductivity type ion implantation layer by penetrating the second conductivity type ion implantation layer.

* * * * *